United States Patent
Lyon

(10) Patent No.: US 8,841,903 B2
(45) Date of Patent: Sep. 23, 2014

(54) METAL DETECTION APPARATUS

(75) Inventor: David Gregory Lyon, Cheshire (GB)

(73) Assignee: Mettler-Toledo Safeline Limited, Manchester (GB)

( * ) Notice: Subject to any disclaimer, the term of this patent is extended or adjusted under 35 U.S.C. 154(b) by 238 days.

(21) Appl. No.: 13/591,900

(22) Filed: Aug. 22, 2012

(65) Prior Publication Data

US 2013/0049745 A1 Feb. 28, 2013

(30) Foreign Application Priority Data

Aug. 24, 2011 (EP) .................................. 11178586

(51) Int. Cl.
| | |
|---|---|
| *G01N 27/72* | (2006.01) |
| *G01R 33/12* | (2006.01) |
| *G01V 3/08* | (2006.01) |
| *G01V 3/10* | (2006.01) |

(52) U.S. Cl.
CPC ........ *G01V 3/104* (2013.01); *G01V 3/10* (2013.01); *G01V 3/107* (2013.01); *G01R 33/12* (2013.01)
USPC ............................ 324/239; 324/228; 324/329

(58) Field of Classification Search
CPC .......... G01R 27/02; G01R 33/12; G01V 3/17; G01V 3/28; G01V 3/104; G01V 3/107; G01V 3/10; G01V 3/11
USPC ................. 324/326, 329, 425–470, 200–263, 324/750.01–764.01; 73/1.01–387, 73/488–551, 861–861.94, 863–866.5, 73/900–901; 336/5–234
See application file for complete search history.

(56) References Cited

U.S. PATENT DOCUMENTS

| | | | |
|---|---|---|---|
| 3,209,245 A | | 9/1965 | Hauge |
| 5,936,399 A | * | 8/1999 | Andermo et al. ........ 324/207.17 |
| 2003/0107377 A1 | | 6/2003 | Uzman |
| 2007/0296415 A1 | * | 12/2007 | Stamatescu ................... 324/345 |
| 2011/0074401 A1 | | 3/2011 | Moskalenko |
| 2012/0086455 A1 | * | 4/2012 | McAdam ..................... 324/326 |

FOREIGN PATENT DOCUMENTS

| | | |
|---|---|---|
| GB | 1436900 | 5/1976 |
| GB | 2423366 A | 8/2006 |
| JP | 2007-278719 A | 10/2007 |
| JP | 2009-37850 A | 2/2009 |
| WO | 02/25318 A1 | 3/2002 |

\* cited by examiner

*Primary Examiner* — Jermele M Hollington
*Assistant Examiner* — Raul Rios Russo
(74) *Attorney, Agent, or Firm* — Standley Law Group LLP

(57) ABSTRACT

A metal detection apparatus that uses one or more operating frequencies. The metal detection apparatus comprises, among other things, a transmitter unit that provides transmitter signals to a transmitter coil that is coupled to a receiver coil, which is connected to the input of a receiver unit. The transmitter unit comprises a frequency generator that provides an operating frequency to the input of an amplifier stage, whose output is connected via a transformer to the transmitter coil. The amplifier stage is connected to a first tap and the transmitter coil is connected to a second tap of the same transformer winding of the transformer. A resonant circuit is formed that is tuned to the operating frequency, and can be tuned optimally and independently of other parts of the transmitter unit.

16 Claims, 1 Drawing Sheet

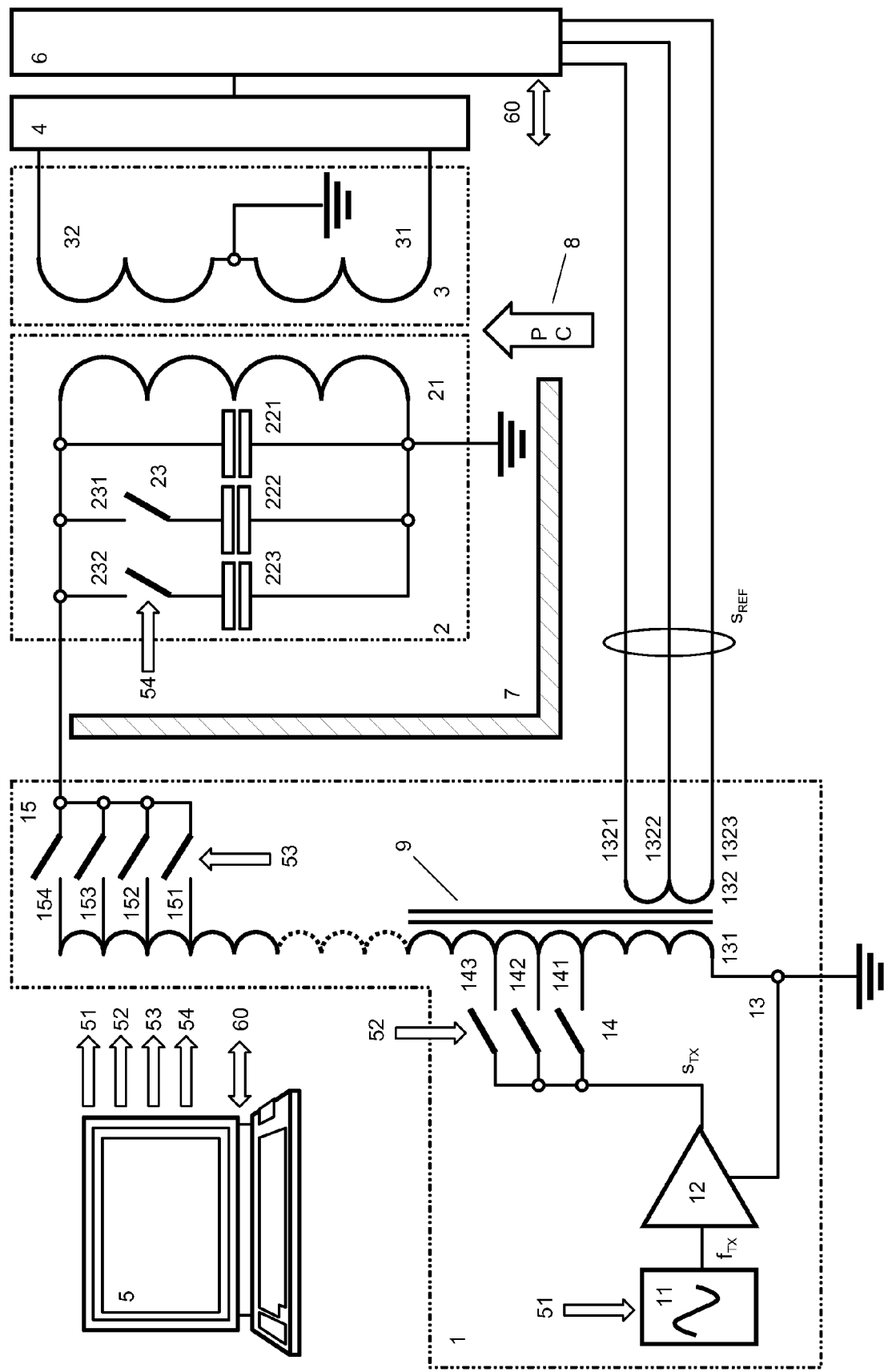

METAL DETECTION APPARATUS

CROSS-REFERENCE TO RELATED APPLICATIONS

This application claims priority under 35 U.S.C. §119 to European Patent Application No. 11178586.1, filed Aug. 24, 2011, which is hereby incorporated by reference in its entirety.

TECHNICAL FIELD

The present invention relates to a metal detection apparatus.

BACKGROUND

Metal detection apparatus are commonly used to detect metal contamination in edible goods and other products. Modern metal apparatus commonly utilize a search head comprising a "balanced coil system" that is capable of detecting all metal contaminant types including ferrous, nonferrous and stainless steels in a large variety of products such as fresh and frozen products.

A metal detection apparatus that operates according to the "balanced coil" principle typically comprises three coils that are wound onto a non-metallic frame, each exactly parallel with the other. The transmitter coil located in the center is energized with a high frequency electric current that generates a magnetic field. The two coils on each side of the transmitter coil act as receiver coils. Since the two receiver coils are identical and installed with the same distance from the transmitter coil, an identical voltage is induced in each of them. In order to receive an output signal that is zero when the system is in balance, the first receiver coil is connected in series with the second receiver coil having an inversed sense of winding. Hence the voltages induced in the receiver coils, that are of identical amplitude and inverse polarity will cancel out one another in the event that the system, in the absence of metal contamination, is in balance.

As a particle of metal passes through the coil arrangement, the high frequency field is disturbed first near one receiver coil and then near the other receiver coil. While the particle of metal is conveyed through the receiver coils the voltage induced in each receiver coil is changed typically in the range of nano-volts. This change in balance results in a signal at the output of the receiver coils that can be processed, amplified and subsequently used to detect the presence of the metal contamination in a product.

The signal processing channels split the received signal into two separate components that are 90° apart from one another. The resultant vector has a magnitude and a phase angle, which is typical for the products and the contaminants that are conveyed through the coils. In order to identify a metal contaminant, "product effects" need to be removed or reduced. If the phase of the product is known then the corresponding signal vector can be reduced. Eliminating unwanted signals from the signal spectrum thus leads to higher sensitivity for signals originating from contaminants.

Methods applied for eliminating unwanted signals from the signal spectrum therefore commonly exploit the fact that the contaminants, the product and other disturbances, have different influences on the magnetic field so that the resulting signals differ in phase.

The signals caused by various metals or products, as they pass through the coils of the metal detection apparatus, can be split into two components, namely resistive and reactive components, according to the conductivity and magnetic permeability of the measured object. For example, the signal caused by ferrite is primarily reactive, while the signal from stainless steel is primarily resistive. Products, which are conductive typically cause signals with a strong resistive component.

Distinguishing between the phases of the signal components of different origin by means of a phase detector allows obtaining information about the product and the contaminants. A phase detector, e.g. a frequency mixer or analog multiplier circuit, generates a voltage signal which represents the difference in phase between the signal input, such as the signal from the receiver coils, and a reference signal provided by the transmitter unit to the receiver unit. Hence, by selecting the phase of the reference signal to coincide with the phase of the product signal component, a phase difference and a corresponding product signal is obtained at the output of the phase detector that is zero. In the event that the phase of the signal components that originate from the contaminants differ from the phase of the product signal component, then the signal components of the contaminants can be detected. However in the event that the phase of the signal components of the contaminants is close to the phase of the product signal component, then the detection of contaminants fails, since the signal components of the contaminants are suppressed together with the product signal component.

In known systems the transmitter frequency is therefore typically selectable in such a way that the phase of the signal components of the metal contaminants will be out of phase with the product signal component. For example, there are known metal detection apparatus that are designed to switch between at least two different operating frequencies such that any metal particle in a product will be subject to scanning at different frequencies. The frequency of operation is rapidly changed so that any metal particle passing through on a conveyor belt will be scanned at two or more different frequencies. In the event that for a first operating frequency the signal component caused by a metal particle is close to the phase of the signal component of the product and thus is masked, then it is assumed that for a second frequency, the phase of the signal component caused by the metal particle will differ from the phase of the signal component of the product so that this signal components can be distinguished. By switching between many frequencies, it is expected that one frequency will provide a suitable sensitivity for any particular metal type, size and orientation.

The drive circuit of the transmitter of such known apparatus comprises an electrically programmable logic device and a driver connected to four field effect transistors, which form a full wave bridge circuit with the transmitter coil connected across.

In another known metal detection apparatus that is designed to switch between at least two different operating frequencies in order to improve metal detection sensitivity, the apparatus is provided with a transmitter and with an amplifier whose output is connected to primary windings of a transformer having a first secondary winding that is connected to the transmitter coil and a second secondary winding that is connected to tuning capacitors that can be switched on or off by means of control switches.

The sensitivity of a metal detection apparatus is not only dependent on the selected frequency, however. Correct calibration of the apparatus is also important, as is optimal performance of the receiving and signal processing unit.

With regard to the former of the above-described known apparatus, it is important to note that the applied switching technology provides of flexibility but may have a negative impact on the quality of the transmitter signals. Due to the rapid signal switching of transistors directly connected to the transmitter coil, disturbances may appear, particularly in the upper range of operating frequencies.

In the latter of the above-described known apparatus, capacity adjustments with the capacitors connected to the transformer may get complicated, thus resulting in restrictions that will not allow achieving optimal sensitivity. Further, losses in the transformer have a negative impact on resonant circuits that are formed by capacitors and transformer coils.

The present invention is therefore directed toward creating an improved metal detection apparatus that uses one or more operating frequencies.

SUMMARY

Particularly, the present invention is directed toward creating a metal detection apparatus that operates with improved signal sensitivity. More particularly, the present invention is directed toward providing a metal detection apparatus with a transmitter that allows efficient generation and transfer of drive signals with high signal quality to a transmitter coil.

An exemplary embodiment of a metal detection apparatus that operates with one or more frequencies comprises a transmitter unit that provides transmitter signals to a transmitter coil that is coupled to a receiver coil, which is connected to the input of a receiver unit. The transmitter unit comprises a frequency generator that provides an operating frequency to the input of an amplifier stage, whose output is connected via a transformer to the transmitter coil.

According to the invention the output of the amplifier stage is connected to a first tap and the transmitter coil is connected to a second tap of the same transformer winding of the transformer, which exhibits a number of n winding coils between the first tap and a common potential and a number of n+m winding coils between the second tap and the common potential. The transmitter coil comprises a number of q winding coils and is connected in parallel to a capacitor thus forming a resonant circuit that is tuned to the operating frequency. The ratio (n+m)/q of the winding coils of the transformer winding and the winding coils of the transmitter coil is selected such that the inductance of the transformer winding is at least ten times higher than the inductance of the transmitter coil.

With this arrangement the resonant circuit, which consists of the transmitter coil and one or more tuning capacitors, can be tuned optimally and independently of other parts of the transmitter unit. Due to the difference in inductances, the transformer is decoupled from the resonant circuit allowing individual optimization of the different parts of the transmitter. A standard class A or B amplifier can be selected to provide an output signal in a suitable voltage range, e.g. 20 Vpp. The transformer can be optimised for reduced losses and voltage conversion, while the resonant circuit is optimised to have a high Q factor. Voltage conversion is done with a single transformer winding that comprises, with regards to the transmitter coil, a relatively high number of winding coils resulting in a high inductance, which practically decouples the transformer from the tuned resonant circuit.

With the implementation of the invention higher voltages and higher drive currents can be obtained for driving the transmitter coil. Values of voltage and current of the tuned resonant circuit may be increased up to a factor of two or more. Simultaneously, interferences and degradations of the drive signal are avoided so that overall a significant increase of sensitivity can be reached.

Preferably the single transformer winding comprises a first and second group of taps allowing selection of the desired voltage that is applied to the resonant circuit.

The invention can be implemented in an apparatus that uses only one operating frequency or that comprises a controllable frequency generator that allows the selection of two or more operating frequencies, preferably in the range of 300 kHz to 850 kHz.

In the event that the metal detection apparatus is designed for operation with two or more operating frequencies, two or more tuning capacitors are provided that are individually or in combination connectable to the transmitter coil such that a resonant circuit is formed that is tuned to the selected operating frequency.

In preferred embodiments the ratio of the inductance of the transformer winding and the inductance of the transmitter coil is selected in the range of 100:1 up to 2,000:1.

Preferably the ratio of the inductance of the transformer winding and the inductance of the transmitter coil is provided in the range of 100:1 up to 200:1 in the range of the lowest operating frequencies, and in the range of 1,000:1 of to 2,000:1 in the range of the highest operating frequencies. Hence, in every field of operation a desirable decoupling of the resonant circuit can be reached.

In an exemplary embodiment, a control unit is provided that is designed in such a way that a first tap is selectable from a first group of taps and/or wherein a second tap is selectable from a second group of taps, so that the ratio (n+m)/n of the winding coils of the transformer winding is raised for higher operating frequencies and reduced for lower operating frequencies. The ratio (n+m)/n is selected such that a desired voltage is generated across the transmitter coil for each operating frequency. Preferably, the ratio (n+m)/n is selected in such a way that the current flowing through the amplifier does not alter significantly when the operating frequency is changed. The taps are selected so that when the transmitter coil has the desired voltage then the current in the amplifier is at an optimum value. Preferably, the amplifier current does not deviate more than 10%-20% from the optimum amplifier current value when the operating frequency is changed.

In embodiments of the invention, the number n+m of winding coils of the transformer winding up to the second tap of the transformer winding may be higher by a factor of 2 to 3 at the lower end of the frequency range of the operating frequencies, and higher by a factor of 5 to 15 at the higher end of the frequency range of the operating frequencies, than the number n of winding coils of the transformer winding up to the first tap of the transformer winding.

In embodiments of the invention, the transformer may comprise a secondary winding having a first tap, a second tap and center tap, from which a reference signal is provided to a signal processing unit provided in the receiver unit, which reference signal is used to detect signal changes induced by products or contaminants that are passing through the transmitter coil and through separate symmetric coil sections of the center tapped receiver coil. With this measure a reference can be obtained that exactly corresponds to the transmitter signal applied to the transmitter coil.

In embodiments of the invention, the tuning capacitors of the resonant circuit may be directly attached to the taps of the transmitter coil. In this way the resonant circuit is kept compact and losses are minimised that would otherwise degrade sensitivity. Preferably, shielding is provided that isolates the resonant circuit from electrical or electronic parts of the metal detection apparatus.

The core of the transformer may be, for example, a ferrite core of the type of a pot core. This type allows manufacturing the inventive transformer as an embodiment having only a single transformer winding turned around a cylindrical core. Such a transformer exhibits desirable characteristics with minimal insertion losses.

BRIEF DESCRIPTION OF THE DRAWINGS

In addition to the features mentioned above, other aspects of the present invention will be readily apparent from the following drawing description and exemplary embodiments, wherein:

FIG. 1 shows a block diagram of an inventive metal detection apparatus.

DETAILED DESCRIPTION OF EXEMPLARY EMBODIMENT(S)

FIG. 1 is a schematic diagram that represents one exemplary embodiment of a metal detection apparatus of the invention, which comprises a transmitter unit 1, a balanced coil system with a transmitter coil 21, a first and a second receiver coil 31, 32, a receiver unit 4, a signal processing unit 6, a control unit 5 that comprises standard interfaces, and input devices and output devices (preferably a keyboard and a monitor). FIG. 1 further symbolically shows a conveyor 8, on which products P, which may comprise contaminants C, are transferred through the transmitter coil 21 and the receiver coils 31, 32.

The transmitter unit 1 comprises a frequency generator 11 that provides a signal with the operating frequency fTX to the input of a power amplifier 12 that operates for example according to class A or B standard. The output of the power amplifier 12 is applied preferably via a switch of a first switch bank 14 to a tap of a first group of taps 141, 142, 143 of a single winding of a transformer 13, which comprises a second group of taps 151, 152, 153, 154 and which is turned around a core 9 (e.g. a ferrite core of the pot-core type having a cylindrical core).

The transmitter coil 21 is connected via a switch of a second switch bank 15 to a tap of the second group of taps 151, 152, 153, 154. Further, a tuning capacitor 221 is firmly connected to the taps of the transmitter coil 21 thus forming a resonant L-C circuit, which is tuned to a first operating frequency fTX of the metal detection apparatus. Over a switch bank 23 with switches 231, 232 additional tuning capacitors 222, 223 can be connected in parallel to the first tuning capacitor 221 in order to adjust the resonant frequency of the resonant circuit to further operating frequencies fTX that can be selected at the frequency generator 11. Hence, the invention can be applied not only in an apparatus that uses only one operating frequency fTX, but with any metal detection apparatus that uses one or more operating frequencies fTX preferably in the range of 300 kHz to 850 kHz.

The transformer winding 131 comprises a number of n winding coils between the first tap 141 of the first group 141, 142, 143 and a common potential, and a number of n+m winding coils between the first tap 151 of the second group of taps 151, 152, 153, 154 and the common potential. The transmitter coil 21 comprises a number of q winding coils.

With the selection of the taps 141, 142, 143; 151, 152, 153, 154 for the interconnection of the power amplifier 12 and the transmitter coil 21, the transmission ratio can suitably be selected over a wide range.

The ratio (n+m)/q of the winding coils of the first transformer winding 131 and the winding coils of the transmitter coil 21 is selected such that the inductance of the first transformer winding 131 is at least ten times higher than the inductance of the transmitter coil 21. With this selection of the ratio (n+m)/q and the resulting difference of inductances, high impedance is obtained for the transformer winding 131 and low impedance is obtained for the transmitter coil 21 incorporated in the resonant circuit. Hence, the influence of the transformer 13 on the resonant circuit remains small. In order to avoid interferences, the resonant circuit is further protected with a metal shielding 7.

In exemplary embodiments, the ratio of the inductance of the first transformer winding 131 and the inductance of the transmitter coil 21 is preferably selected dependent on the operating frequency fTX to be in the range of between 100:1 and 2,000:1. With an increase of the ratio of the inductances, an optimal decoupling of the resonant circuit can be obtained.

Preferably a ratio of the inductance of the first transformer winding 131 to the inductance of the transmitter coil 21 is provided to be in the range of 100:1 up to 200:1 in the range of the lowest selectable operating frequencies fTX. In the range of the highest operating frequencies fTX, a ratio of the inductance of the first transformer winding 131 to the inductance of the transmitter coil 21 is provided preferably in the range of 1,000:1 to 2,000:1.

In an exemplary embodiment the number n+m of winding coils of the first transformer winding 131 up to the first tap 151 of the second group 151; 152; 153; 154 is higher by a factor of 2 to 3 at the lower end of the frequency range of the operating frequencies fTX, and higher by a factor of 5 to 15 at the higher end of the frequency range of the operating frequencies fTX than the number n of winding coils of the first transformer winding 131 up to the first tap 141 of the first group of taps 141, 142, 143 of the first transformer winding 131.

The number n of winding coils between the first tap 141 of the first group 141, 142, 143 and common potential may be, for example, equal to 5. The number mL of winding coils between the first tap 151 of the second group 151, 152, 153, 154 and common potential may be, for example, equal to 11. The number mH of winding coils between the last tap 154 of the second group 151, 152, 153, 154 and a common potential may be, for example, equal to 33. Preferably, the winding coils between the various taps 151, 152, 153, 154 are distributed equally.

The first group of taps may, for example, be reduced to a single tap 141. However with more than one tap 141, 142, 143, the flexibility for selecting suitable voltages is significantly enhanced.

The settings of the switch banks 14 and 15 is preferably selected in such a way that the ratio (n+m)/n of the winding coils of the first transformer winding (131) is raised for higher operating frequencies fTX and reduced for lower operating frequencies fTX.

With this measure, the voltage generated across the transmitter coil 21 can be individually adjusted for each operating frequency fTX. In preferred embodiments, the switch banks 14 and 15 are actuated in such a way that the current flowing in the power amplifier 12 is kept approximately constant independently of the selected operating frequency fTX. Hence, the power amplifier operates in a preferred mode. As a result a stable performance of the metal detection apparatus over the whole range of operating frequencies fTX is achieved. Adjustments and automatic control, closed loop circuitry for adjusting the receiver gain, and erroneous measurement results caused by amplitude changes together with frequency changes can be avoided.

In FIG. 1, it is further shown that the first transformer winding 131 is coupled to a second transformer winding 132, which comprises between a first and second tap 1321, 1323, a center tap 1322. The voltage appearing across the second winding 132, which is fed as a reference signal sREF to the signal processing unit 6, corresponds exactly to the signal appearing across the receiver coil 3 when no products P and/or contaminants C pass through the balanced coil system 21, 3. Hence, with the reference signal sREF, changes of the received signal induced by products P or contaminants C can exactly be detected. Since the reference signal sREF is phase-locked to the transmitter signal sTX at the output of the power amplifier 12, detection of signal changes can be performed with highest accuracy. Phase shifts are avoided that may otherwise occur in logic modules of the transmitter electronics.

Embodiments of metal detection apparatus of the invention may further comprise a control unit 5 that controls, via a control line 51, the frequency generator 11; via a control line 52, the settings of the switch bank 14; via a control line 53, the switch bank 15; and via a control line 54, the switches 231, 232 of the tuning capacitors 222, 223 of the resonant circuit. Further, the control unit 5 may be connected to the signal processing unit 6 via a communication channel 60. The control unit 5 preferably comprises a computer program that supports automated operation of the inventive metal detection apparatus.

While certain exemplary embodiments of the present invention are described in detail above, the scope of the invention is not to be considered limited by such disclosure, and modifications are possible without departing from the spirit of the invention as evidenced by the following claims:

What is claimed is:

1. A metal detection apparatus comprising:
   a transmitter unit adapted to provide transmitter signals to a transmitter coil that is coupled to a receiver coil, the receiver coil connected to the input of a receiver unit;
   a frequency generator associated with the transmitter unit, the frequency generator for providing an operating frequency to the input of an amplifier stage whose output is connected via a transformer to the transmitter coil and to a first tap of a first transformer winding;
   a second tap of the same first transformer winding connected to the transmitter coil, the transformer winding having a number of n winding coils between the first tap and a common potential and a number of n+m winding coils between the second tap and the common potential;
   wherein the transmitter coil comprises a number of q winding coils and is connected in parallel to a capacitor, thus forming a resonant circuit that is tuned to the operating frequency; and
   wherein the ratio (n+m)/q of the winding coils of the first transformer winding and the winding coils of the transmitter coil is selected such that the inductance of the first transformer winding is at least ten times higher than the inductance of the transmitter coil.

2. A metal detection apparatus according to claim 1, wherein the number n+m of winding coils of the first transformer winding up to the second tap is higher by a factor of 2 to 3 at the lower end of the frequency range of the operating frequencies, and higher by a factor of 5 to 15 at the higher end of the frequency range of the operating frequencies, than the number n of winding coils of the first transformer winding up to the first tap of the first transformer winding.

3. A metal detection apparatus according to claim 1, wherein the transformer includes a secondary winding having a first tap, a second tap, and a center tap from which a reference signal is provided to a signal processing unit located in the receiver unit, which reference signal is used to detect signal changes induced by products or contaminants that are passing through the transmitter coil and through separate symmetric coil sections of the center tapped receiver coil.

4. A metal detection apparatus according to claim 1, wherein the transformer comprise a ferrite core of the pot core type.

5. A metal detection apparatus according to claim 1, wherein the first tap is selectable from a first group of taps and/or wherein the second tap is selectable from a second group of taps that are connected to the first transformer winding having a number of winding coils, allowing the selection of ratios (n+m)/n in the range from 1 to 15.

6. A metal detection apparatus according to claim 5, further comprising a control unit that is adapted such that the first tap is selectable from a first group of taps and/or wherein the second tap is selectable from a second group of taps such that the ratio (n+m)/n of the winding coils of the first transformer winding is raised for higher operating frequencies and reduced for lower operating frequencies.

7. A metal detection apparatus according to claim 6, wherein the ratio (n+m)/n is selectable for each operating frequency such that a desired voltage is generated across the transmitter coil and that the current in the amplifier is approximately constant at an optimum value for all operating frequencies selected.

8. A metal detection apparatus according to claim 1, wherein the frequency generator is a controllable frequency generator that allows for the selection of two or more operating frequencies, preferably in the range of 300 kHz to 850 kHz.

9. A metal detection apparatus according to claim 8, wherein one or more tuning capacitors are provided, the one or more tuning capacitors individually or in combination connectable to the transmitter coil such that a resonant circuit is formed that is tuned to the selected operating frequency.

10. A metal detection apparatus according to claim 9, wherein the tuning capacitors are directly attached to the taps of the transmitter coil.

11. A metal detection apparatus according to claim 8, wherein the ratio of the inductance of the first transformer winding to the inductance of the transmitter coil is selectable in the range of 100:1 up to 2,000:1.

12. A metal detection apparatus according to claim 11, wherein the ratio of the inductance of the first transformer winding to the inductance of the transmitter coil is provided in the range of 100:1 to 200:1 towards the lowest operating frequencies, and in the range of 1,000:1 to 2,000:1 towards the highest operating frequencies.

13. A metal detection apparatus comprising:
   a transmitter unit adapted to provide transmitter signals to a transmitter coil that is coupled to a receiver coil, the receiver coil connected to the input of a receiver unit;
   a frequency generator associated with the transmitter unit, the frequency generator for providing an operating frequency to the input of an amplifier stage whose output is connected via a transformer to the transmitter coil and to a first tap of a first transformer winding; and
   a second tap of the same first transformer winding connected to the transmitter coil, the transformer winding having a number of n winding coils between the first tap and a common potential and a number of n+m winding coils between the second tap and the common potential;
   wherein the transmitter coil comprises a number of q winding coils and is connected in parallel to a capacitor, thus forming a resonant circuit that is tuned to the operating frequency.

14. A metal detection apparatus comprising:
a transmitter unit adapted to provide transmitter signals to a transmitter coil that is coupled to a receiver coil, the receiver coil connected to the input of a receiver unit;
a controllable frequency generator associated with the transmitter unit, the frequency generator allowing for the selection of two or more operating frequencies preferably in the range of 300 kHz to 850 kHz to be provided to the input of an amplifier stage whose output is connected via a transformer to the transmitter coil and to a first tap of a first transformer winding;
a second tap of the same first transformer winding connected to the transmitter coil, the transformer winding having a number of n winding coils between the first tap and a common potential and a number of n+m winding coils between the second tap and the common potential; and
a control unit that is adapted such that the first tap is selectable from a first group of taps and/or wherein the second tap is selectable from a second group of taps such that the ratio (n+m)/n of the winding coils of the first transformer winding is raised for higher operating frequencies and reduced for lower operating frequencies, and the ratio (n+m)/n is selectable for each operating frequency such that a desired voltage is generated across the transmitter coil and that the current in the amplifier is approximately constant at an optimum value for all operating frequencies selected;
wherein the transmitter coil comprises a number of q winding coils and is connected in parallel to a capacitor, thus forming a resonant circuit that is tuned to the operating frequency; and
wherein the ratio (n+m)/q of the winding coils of the first transformer winding and the winding coils of the transmitter coil is selected such that the inductance of the first transformer winding is at least ten times higher than the inductance of the transmitter coil.

15. A metal detection apparatus according to claim 14, wherein one or more tuning capacitors are provided, the one or more tuning capacitors individually or in combination connectable to the transmitter coil such that a resonant circuit is formed that is tuned to the selected operating frequency.

16. A metal detection apparatus according to claim 15, wherein the tuning capacitors are directly attached to the taps of the transmitter coil.

* * * * *